(12) United States Patent
Qin et al.

(10) Patent No.: US 12,224,294 B2
(45) Date of Patent: Feb. 11, 2025

(54) ARRAY SUBSTRATE, DISPLAY SUBSTRATE AND DISPLAY DEVICE

(71) Applicant: BOE TECHNOLOGY GROUP CO., LTD., Beijing (CN)

(72) Inventors: Yunke Qin, Beijing (CN); Lei Wang, Beijing (CN); Yue Tong, Beijing (CN); Wenhao Tian, Beijing (CN); Xuan Feng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/021,048

(22) PCT Filed: Feb. 22, 2022

(86) PCT No.: PCT/CN2022/077222
§ 371 (c)(1),
(2) Date: Feb. 13, 2023

(87) PCT Pub. No.: WO2023/159341
PCT Pub. Date: Aug. 31, 2023

(65) Prior Publication Data
US 2024/0128288 A1    Apr. 18, 2024

(51) Int. Cl.
*H01L 27/146* (2006.01)
*G02F 1/133* (2006.01)
(Continued)

(52) U.S. Cl.
CPC .... *H01L 27/14612* (2013.01); *G02F 1/13318* (2013.01); *G02F 1/133512* (2013.01);
(Continued)

(58) Field of Classification Search
CPC ......... H01L 27/14612; H01L 27/14649; H01L 27/14636; G02F 1/13439; G02F 1/1368; G02F 2202/104
(Continued)

(56) References Cited

U.S. PATENT DOCUMENTS

| 2011/0109532 A1 | 5/2011 | Choi |
| 2019/0064621 A1 | 2/2019 | Liu et al. |

(Continued)

FOREIGN PATENT DOCUMENTS

| CN | 107479281 A | 12/2017 |
| CN | 110176203 A | 8/2019 |

(Continued)

*Primary Examiner* — Charles S Chang
(74) *Attorney, Agent, or Firm* — WHDA, LLP

(57) ABSTRACT

This disclosure provides an array substrate, including: a display region and a peripheral region. The peripheral region includes at least one first sensor. The first sensor includes a photodiode and a driving circuit which are electrically connected to each other. The photodiode includes: an anode, a cathode and a photosensitive material layer. The array substrate includes: a base substrate, a plurality of thin film transistors, a common electrode and a pixel electrode. The common electrode is reused as an anode of the photodiode. The pixel electrode is reused as a cathode of the photodiode. One of the plurality of thin film transistors is reused as a first transistor of the driving circuit.

20 Claims, 10 Drawing Sheets

(51) Int. Cl.
  *G02F 1/1335* (2006.01)
  *G02F 1/1343* (2006.01)
  *G02F 1/1362* (2006.01)
  *G02F 1/1368* (2006.01)

(52) U.S. Cl.
  CPC .... *G02F 1/133514* (2013.01); *G02F 1/13439* (2013.01); *G02F 1/136286* (2013.01); *G02F 1/1368* (2013.01); *H01L 27/14649* (2013.01); *G02F 2202/104* (2013.01); *H01L 27/14636* (2013.01)

(58) Field of Classification Search
  USPC .............................................. 349/11–13, 116
  See application file for complete search history.

(56) References Cited

U.S. PATENT DOCUMENTS

2020/0091253 A1\* 3/2020 Liu ................... H01L 29/66992
2021/0326554 A1   10/2021 Wang et al.

FOREIGN PATENT DOCUMENTS

| CN | 110718565 A | 1/2020 |
|---|---|---|
| CN | 111599825 A | 8/2020 |
| CN | 113359292 A | 9/2021 |
| CN | 113937139 A | 1/2022 |

\* cited by examiner

ARRAY SUBSTRATE, DISPLAY SUBSTRATE AND DISPLAY DEVICE

CROSS-REFERENCE TO RELATED APPLICATIONS

This application is the U.S. national phase of PCT Application No. PCT/CN2022/077222 filed on Feb. 22, 2022, the disclosure of which is hereby incorporated by reference in its entirety.

TECHNICAL FIELD

The present disclosure relates to the field of display technology, and more particularly, to an array substrate, a display substrate, and a display device.

BACKGROUND

The function of eye movement tracking applied in head-mounted virtual reality (VR) equipment is gradually becoming the standard configuration of VR glasses because it can provide products with advantages in terms of interaction, display, rendering, content, etc. Conventionally, the main commercial eye movement tracking method is infrared imaging, i.e., obtaining an eyeball image by adding a near-infrared active light source and an infrared imaging module. The pupil center is located by image processing using the reflectivity difference between pupil and sclera, iris and skin, and then the fixation point is calculated.

FIG. 1 is an architectural diagram of an eye tracking scheme in the related art. The light source is a near-infrared active light source, and the sensing devices are distributed outside the active area (AA). Through the optical structure design, in combination with the design of the sensor, the sensing devices can receive the lateral or longitudinal light superposition. A pupil center position is determined based on the obtained lateral and longitudinal data. The coordinates of the fixation point are calculated from this position through a pre-established mapping relationship.

However, in the related art, a separate CMOS camera module is used, and assembled directly as one component in a VR product, which leads to a larger size of the overall VR product. In addition, since the CMOS is a silicon-based sensor, the price thereof is uncompetitive against a glass-based sensor.

SUMMARY

In a first aspect of the present disclosure, an array substrate is provided, including: a display region and a peripheral region surrounding the display region, the peripheral region including at least one first sensing region; each of the at least one first sensing region being provided with at least one first sensor, the at least one first sensor each including a photodiode and a driving circuit electrically connected to each other, the photodiode including: an anode and a cathode arranged opposite to each other, and a photosensitive material layer between the anode and the cathode; the array substrate including: a base substrate; a plurality of thin film transistors on the base substrate, the thin film transistor including a source and a drain; a common electrode on a side of the plurality of thin film transistors away from the base substrate; a pixel electrode on a side of the common electrode away from the base substrate, the pixel electrode being electrically connected to the drains of the thin film transistors; wherein, the common electrode is reused as an anode of the photodiode; the pixel electrode is reused as a cathode of the photodiode. the driving circuit includes at least a first transistor, one thin film transistor of the plurality of thin film transistors is reused as the first transistor, and a drain of the first transistor is electrically connected to the cathode of the photodiode.

Optionally, the photodiode further includes a hole transport layer between the anode and the photosensitive material layer, wherein the hole transport layer is made of any one of molybdenum oxide, nickel oxide, copper chloride, copper sulfide and tungsten oxide; the photodiode further includes an electron transport layer between the photosensitive material layer and the cathode, the electron transport layer is made of any one of zinc oxide, zinc tin oxide, indium gallium zinc oxide, zinc aluminum oxide.

Optionally, the first transistor is an oxide thin film transistor, an orthographic projection of an active layer of the first transistor onto the base substrate is located within an orthographic projection of a gate of the first transistor onto the base substrate, or the orthographic projection of the gate of the first transistor onto the base substrate is located within the orthographic projection of the active layer of the first transistor onto the base substrate.

Optionally, the driving circuit further includes: a data line and a scanning line, wherein the data line is electrically connected to the source of the first transistor; the scanning line is electrically connected to the gate of the first transistor.

Optionally, an orthographic projection of the data line onto the base substrate does not overlap with an orthographic projection of the photosensitive material layer of the photodiode onto the base substrate.

Optionally, the driving circuit further includes: a second transistor, a third transistor, a reset signal line, a power supply signal line and an initialization signal line; wherein a source of the second transistor is electrically connected to the power supply signal line, a drain of the second transistor is electrically connected to the drain of the first transistor, and a gate of the second transistor is electrically connected to the cathode of the photodiode; a source of the third transistor is electrically connected to the initialization signal line, a drain of the third transistor is electrically connected to the cathode of the photodiode, and a gate of the third transistor is electrically connected to the reset signal line; the anode of the photodiode is connected to a bias voltage.

Optionally, the bias voltage is 0 V to −6 V.

Optionally, the third transistor is an oxide thin film transistor, and the second transistor is a low-temperature polysilicon thin film transistor.

Optionally, the orthographic projection of the photosensitive material layer of the photodiode onto the base substrate does not overlap with an orthographic projection of the first transistor, the second transistor and the third transistor of the driving circuit onto the base substrate.

Optionally, the array substrate further includes: an insulating layer between the common electrode and the pixel electrode, the insulating layer including a plurality of recesses; the insulating layer is on a side of the photosensitive material layer away from the base substrate; the pixel electrode is bonded to the photosensitive material layer in the recesses.

Optionally, the common electrode includes at least a metal layer and a transparent electrically conductive layer arranged in a stack, and the metal layer is made of any one of aluminum, silver, copper, and iron.

Optionally, the display region includes at least one second sensing region; each of the at least one second sensing region is provided with at least one second sensor.

A second aspect of the present disclosure provides a display substrate, including the array substrate described above and a color film substrate, wherein the color film substrate includes a black matrix, a peripheral region of the black matrix includes at least one third sensing region, and the at least one third sensing region is in a one-to-one correspondence with the at least one first sensing region of the array substrate; each of the at least one third sensing region includes at least one slit, the at least one slit is in a one-to-one correspondence with the at least one first sensor.

A third aspect of the present disclosure provides a display device including the display substrate described above.

REFERENCE NUMERALS

Figure 1:
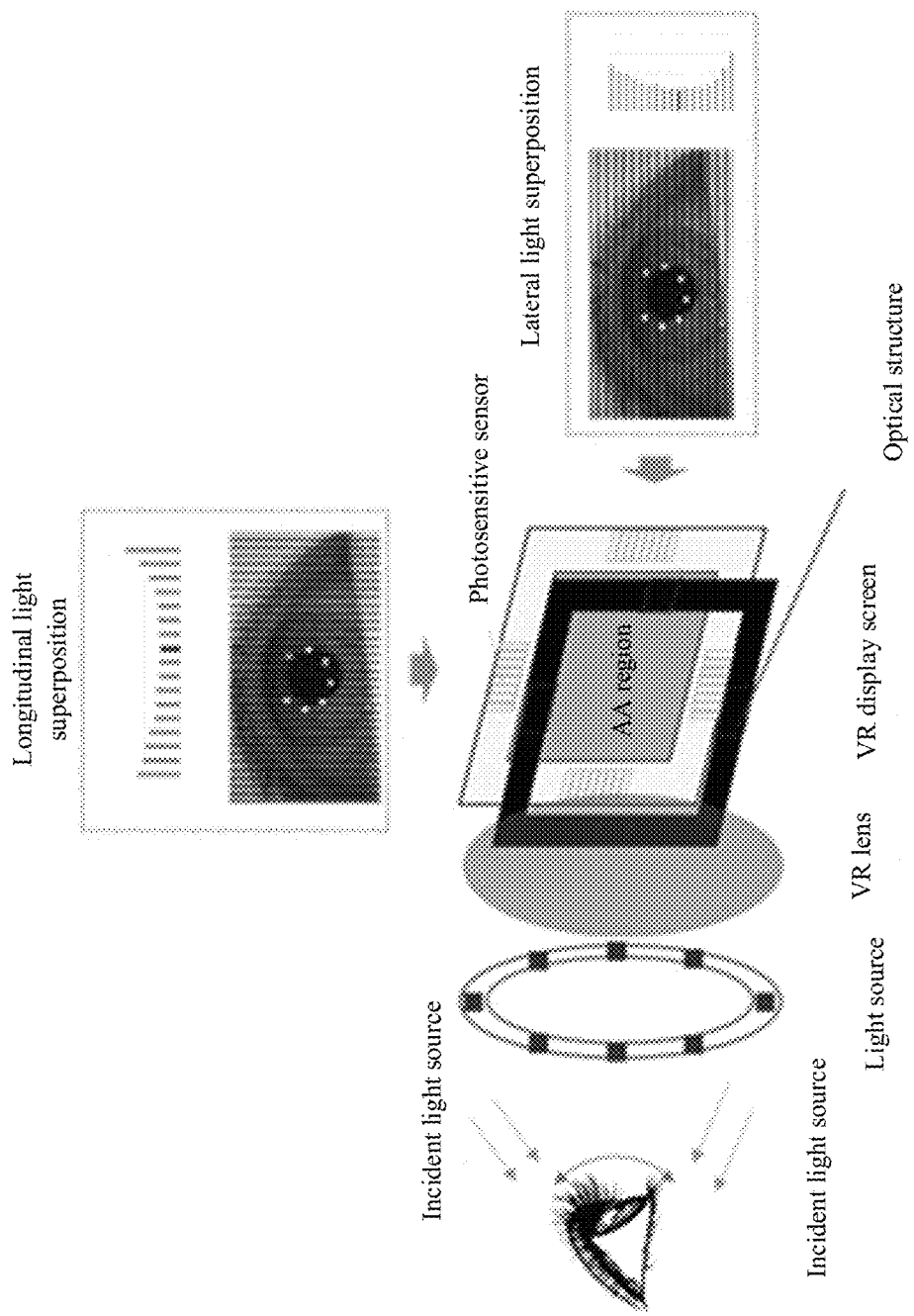
FIG. 1 is an architectural diagram of an eye tracking scheme in the related art.

1—Base Substrate 2—Buffer layer 3—First gate insulating layer 4—First interlayer dielectric layer 5—Second passivation layer 6—Second interlayer dielectric layer 7—Planarization layer 8—First passivation layer 9—Third passivation layer 10a—First spacer 10b—Second spacer 11a—First PI alignment layer 11b—Second PI alignment layer 12—Liquid crystal layer 13—OC layer 14a—First sub-pixel 14b—Second sub-pixel 14c—Third sub-pixel 15—Slit 16—Black matrix 17—Substrate 18—Second transparent electrically conductive layer 19—Metal layer 20—First transparent electrically conductive layer 21—Photosensitive material layer 22—light-shielding layer 23—Second gate insulating layer 24—Third interlayer dielectric layer 25—Electron transport layer 26—Hole transport layer 1010—Connecting portion 1011—First connecting portion 1012—Second connecting portion 1013—Third connecting portion T1—First transistor T2—Second transistor T3—Third transistor 31—Scanning line 32—Data line 33—Reset signal line 34—Power supply signal line 35—Initialization signal line

DETAILED DESCRIPTION

In order that the technical problems, technical solutions, and advantages to be solved by the embodiments of the present disclosure will become more apparent, a detailed description will be given below with reference to the accompanying drawings and specific embodiments.

In order to solve the problem in the related art that a near-infrared sensor device occupies substantial space of a panel, the embodiments of the present disclosure provide an array substrate, a display substrate and a display device, so as to realize the integration of a near-infrared sensor, thereby saving space of a display panel, and reduce the size or weight of a module in the related art, as well as the cost thereof.

An embodiment of the present disclosure provides an array substrate, including: a display region and a peripheral region surrounding the display region, wherein the peripheral region includes at least one first sensing region; each of the at least one first sensing region is provided with at least one first sensor, the first sensor includes a photodiode and a driving circuit electrically connected to each other, the photodiode includes: an anode and a cathode arranged opposite to each other, and a photosensitive material layer between the anode and the cathode; the array substrate includes: a base substrate; a plurality of thin film transistors on the base substrate, the thin film transistor including a source and a drain; a common electrode on a side of the plurality of thin film transistors away from the base substrate; a pixel electrode on a side of the common electrode away from the base substrate, the pixel electrode being electrically connected to the drains of the thin film transistors; wherein, the common electrode is reused as an anode of the photodiode; the pixel electrode is reused as a cathode of the photodiode; the driving circuit includes at least a first transistor, one thin film transistor of the plurality of thin film transistors is reused as the first transistor, and a drain of the first transistor is electrically connected to the cathode of the photodiode. In the array substrate provided by the embodiment of the present disclosure, integration of a near-infrared sensor is realized by reusing the common electrode as the anode of the photodiode, reusing the pixel electrode as the cathode of the photodiode, and incorporating a thin film transistor (TFT) as a switch.

Figure 14:
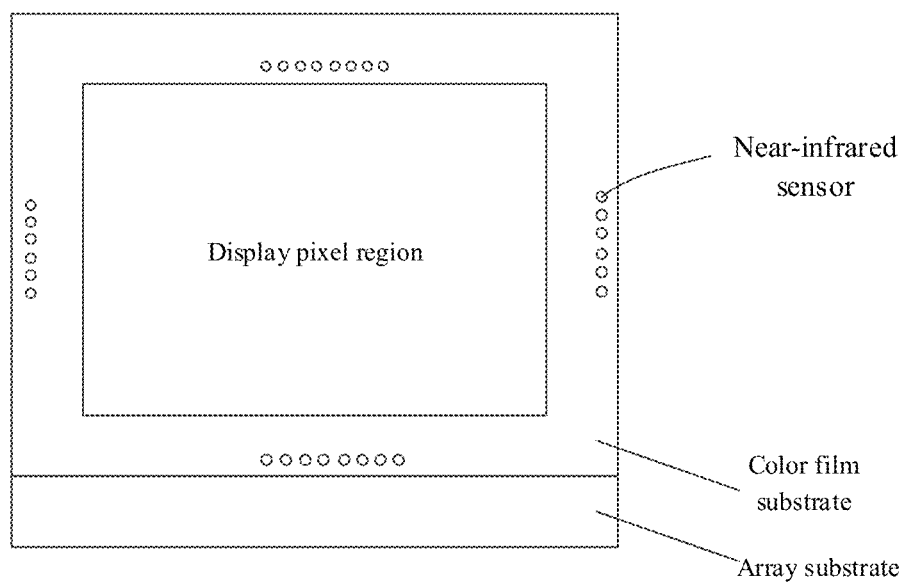
FIG. 14 is a schematic diagram showing the location of a near-infrared sensor according to an embodiment of the present disclosure.

Optionally, the first sensing region includes a near-infrared sensing region, and the first sensor includes a near-infrared sensor. FIG. 14 is a schematic diagram showing the location of a near-infrared sensor according to an embodiment of the present disclosure. The peripheral region includes a left border region, a right border region, an upper border region and a lower border region. The near-infrared sensor is provided in at least one of the left border region, the right border region, the upper border region or the lower border region.

Figure 2:
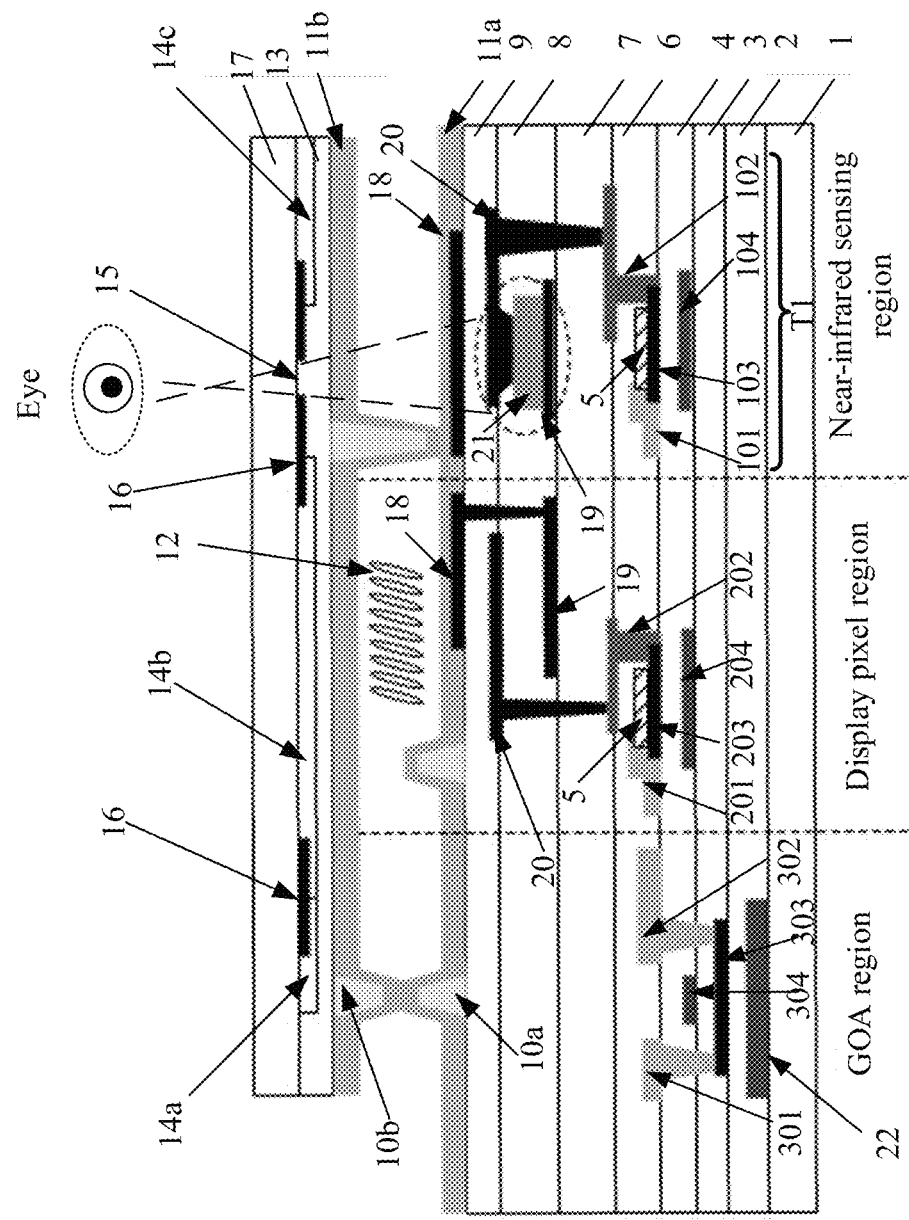
FIG. 2 is a schematic diagram showing the structure of a display substrate according to an embodiment of the present disclosure.
Figure 3:
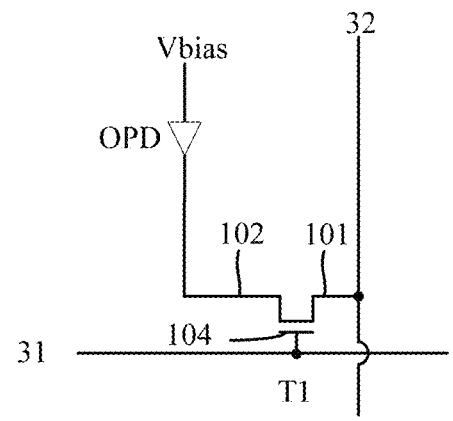
FIG. 3 is a schematic diagram of a driving circuit according to an embodiment of the present disclosure.
Figure 4:
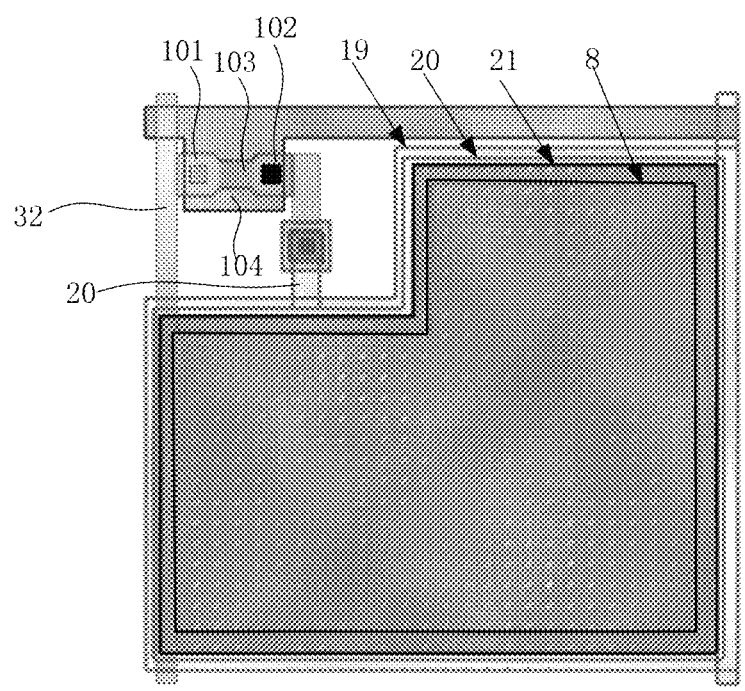
FIG. 4 is a schematic diagram showing the layout of a driving circuit according to an embodiment of the present disclosure.

With reference to FIGS. 2, 3 and 4, the layout of film layers corresponding to the array substrate of the embodiment of the present disclosure includes a base substrate 1 and following layers which are stacked in sequence along a direction away from the base substrate 1: a light-shielding layer 22, a buffer layer 2, a Poly-Si layer, a first gate insulating layer 3, a first gate metal layer, a first interlayer dielectric layer 4, an oxide active layer, a second passivation layer 5, a first source/drain metal layer, a second interlayer dielectric layer 6, a second source/drain metal layer, a planarization layer 7, a metal layer 19, a photosensitive material layer 21, a first passivation layer 8, a first transparent electrically conductive layer 20, a third passivation layer 9, a second transparent electrically conductive layer 18, a first spacer layer 10*a* and a first PI alignment layer 11*a*.

The color film substrate of the embodiment of the present disclosure includes: a substrate 17, a plurality of sub-pixels on the substrate, a black matrix 16 between sub-pixels of different colors, an OC (over coat) layer 13 overlying the plurality of sub-pixels, the second spacer 10*b*, and the second PI alignment layer 11*b*.

A liquid crystal layer 12 is located in the space enclosed by the array substrate and the color film substrate.

The plurality of sub-pixels include a first sub-pixel 14*a*, a second sub-pixel 14*b* and a third sub-pixel 14*c*. Optionally, the first sub-pixel 14*a* is a green sub-pixel, the second sub-pixel 14*b* is a red sub-pixel, and the third sub-pixel is a blue sub-pixel.

It is to be noted that the buffer layer 2 and the first gate insulating layer 3 do not require a mask process.

In the array substrate according to the embodiment of the present disclosure, low-temperature poly-silicon (LTPS) thin film transistors (TFTs) are used in a gate driver on array (GOA) region, and oxide TFTs are used in the display region and the near-infrared sensing region.

The TFTs of the GOA region each include a source 301, a drain 302, an active layer 303 and a gate 304. The source 301 and the drain 302 are formed using the first source/drain metal layer, the active layer 303 is formed using the Poly-Si layer, and the gate 304 is formed using the first gate metal layer. The light-shielding layer 22 is provided under the active layer 303 to shield against stray light.

The TFTs of the display pixel region each include a source 201, a drain 202, an active layer 203 and a gate 204. The source 201 is formed using the first source/drain metal layer, the drain 202 is formed using the second source/drain metal layer, the active layer 203 is formed using the oxide active layer, and the gate 204 is formed using the first gate metal layer.

In the display region, the metal layer 19 and the second transparent electrically conductive layer 18 are connected together to form a common electrode, and the first transparent electrically conductive layer 20 serves as a pixel electrode. The metal layer 19 may also be made of an indium tin oxide (ITO) material transparent to visible light.

The near-infrared sensor according to the embodiments of the present disclosure is disposed in the near-infrared sensing region. The photodiode of the near-infrared sensor includes an anode and a cathode oppositely disposed, and a photosensitive material layer disposed between the anode and the cathode. The anode of the photodiode is formed using the metal layer 19, and the cathode of the photodiode is formed using the first transparent electrically conductive layer 20. In the near-infrared sensing region, the electric potential of the metal layer 19 is generally different from that of the second transparent electrically conductive layer 18, so that the metal layer 19 and the second transparent electrically conductive layer 18 above the metal layer 19 are not connected to each other. If the metal layer 19 and the second transparent electrically conductive layer are at the same electric potential, they may be connected to each other.

Optionally, the common electrode includes at least a metal layer and a transparent electrically conductive layer which are arranged in a stack, and the metal layer is made of any one of aluminum, silver, copper, and iron.

The metal layer according to embodiments of the present disclosure can prevent bottom stray light (backlight) from interfering with OPD.

Mainly considering that metal can block the interference of the bottom stray light (backlight) on the OPD, it is recommended to adopt a stack structure of 'metal+ITO' for the metal layer 19; and considering the work function matching relationship between the metal layer 19 and the material above the metal layer 19, silver is often used. Of course, if the near-infrared sensing region is far away from the display pixel region, or the bottom stray light (backlight) may be spatially avoided, the metal layer may be made of an ITO material.

Optionally, the photosensitive material layer is made of an organic photosensitive material.

The organic photosensitive material according to the embodiments of the present disclosure is thin and light, and has a relatively high light absorption coefficient. The organic structure can be easily designed and modified, and the resulting material has a simple manufacturing process, and can be made into a large-area flexible device.

Photosensitive materials can be divided into organic materials and inorganic materials.

With regard to organic materials, a P-type (hole-transporting) material and an N-type (electron-transporting) material are generally blended to form a photoactive layer, so as to further form OPD devices applicable to the field of photosensitive detectors. Photosensitive wavebands can be determined by different material formulations. When used for eye tracking, the photoactive layer generally needs to have a good response to the near-infrared waveband around 850 nm.

With regard to inorganic materials, a positive-intrinsic-negative (PIN) material is most commonly used in the field of glass-based display panels, but the photosensitive waveband of PIN is visible light, which is not suitable for eye tracking applications.

The first transistor T1 of the driving circuit is one thin film transistor on the array substrate. The first transistor T1 includes a source 101, a drain 102, an active layer 103 and a gate 104. The source 101 is formed using the first source/drain metal layer, the drain 102 is formed using the second source/drain metal layer, the active layer 103 is formed using the oxide active layer, and the gate 104 is formed using the first gate metal layer. The drain 102 of the first transistor T1 is electrically connected to the cathode of the photodiode.

Optionally, the first transistor includes a data read-out transistor.

For a sensing device, a photodiode generates an electrical signal when irradiated by light. The TFT serves as a switching device. When the TFT is off, the electrical signal is accumulated; when the TFT is on, the electrical signal flows out and is read by an integrated circuit (IC) at the back end.

Optionally, the photodiode further includes a hole transport layer between the anode and the photosensitive material layer, the hole transport layer is made of any one of molybdenum oxide, nickel oxide, copper chloride, copper sulfide and tungsten oxide; the photodiode further includes an electron transport layer between the photosensitive material layer and the cathode, the electron transport layer is made of any one of zinc oxide, zinc tin oxide, indium gallium zinc oxide, zinc aluminum oxide.

The hole transport layer according to an embodiment of the present disclosure employs molybdenum oxide, which has a good hole transport ability, and can improve the photoelectric conversion efficiency of the photodiode. The electron transport layer according to an embodiment of the present disclosure employs zinc oxide, which has a good electron transport ability and can improve the photoelectric conversion efficiency of the photodiode.

Figure 13:
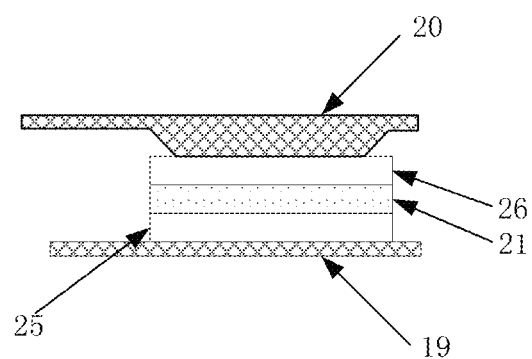
FIG. 13 is a schematic diagram showing the structure of a photodiode according to an embodiment of the present disclosure.

Referring to FIG. 13, OPM is an organic photoelectric material, and zinc oxide and molybdenum oxide serve as the electron transport layer and the hole transport layer, respectively. These three kinds of materials can be prepared by evaporation or printing, in addition to the exposure process in the display panel.

Optionally, the first transistor is an oxide thin film transistor, and the first transistor is a bottom gate type transistor. The gate of the bottom gate type transistor is on a side of the active layer close to the base substrate, and an orthographic projection of the active layer of the bottom gate type transistor onto the base substrate is located within an orthographic projection of the gate of the first transistor onto the base substrate.

The oxide semiconductor material of the oxide thin film transistor according to the embodiments of the present disclosure has advantages such as high carrier mobility, low preparation temperature, good electrical uniformity, transparency to visible light, and low cost.

Referring to FIGS. 2, the gate 104 of the first transistor T1 is on a side of the active layer 103 close to the base substrate 1, namely, the first transistor T1 is of a bottom gate structure.

The oxide thin film transistor has a low leakage current, and based on this, for a liquid crystal display (LCD) panel, which is generally a 1T1C pixel circuit, using oxide TFT enables a longer capacitance holding time and a longer image quality holding time, so that the latest adaptive frequency shift display technology can be supported, and there is a benefit in power consumption. For a sensor, lower dark current means lower dark state noise, while also reducing the loss of optical signal generated in the organic photodiode (OPD), which is beneficial for improving the signal-to-noise ratio of the sensor.

Optionally, the array substrate further includes a first passivation layer between the common electrode and the pixel electrode, and the first passivation layer includes a plurality of recesses;
the first passivation layer is on a side of the photosensitive material layer away from the base substrate;
the pixel electrode is bonded to the photosensitive material layer in the recesses.

In the embodiments of the present disclosure, a complete organic photodiode unit can be formed by bonding the pixel electrode with the photosensitive material layer in the recesses.

Optionally, the driving circuit further includes: a data line and a scanning line, wherein the data line is electrically connected to the source of the first transistor; the scanning line is electrically connected to the gate of the first transistor.

In the embodiments of the present disclosure, with the source of the first transistor being electrically connected to the data line, the data line can provide a data signal to the first transistor. In the embodiments of the present disclosure, with the gate of the first transistor being electrically connected to the scanning line, the scanning line can provide a scanning signal to the first transistor.

Referring to FIGS. 3 and 4, a source 101 of the first transistor T1 is electrically connected to a data line 32 for providing a data signal. A gate 104 of the first transistor T1 is electrically connected to a scanning line 31, a drain of the first transistor T1 is electrically connected to a cathode of an organic photodiode (OPD), and an anode of the organic photodiode (OPD) is connected to a bias voltage Vbias.

Optionally, the bias voltage is 0 V to −6 V, the bias voltage being a negative voltage.

In the array substrate according to the embodiment of the present disclosure, the bias voltage of the anode of the photodiode is 0 to −6V, which enables a normal operation state of the photodiode.

Optionally, an orthographic projection of the data line onto the base substrate does not overlap with an orthographic projection of the photosensitive material layer of the photodiode onto the base substrate.

The data line according to the embodiments of the present disclosure is used for transmitting the data signal, and interference between the data line and the photosensitive material layer can be avoided by keeping the photosensitive material layer of the photodiode away from the data line. During illumination and data signal transmission, the electric potential of the bottom electrode of the photodiode is variable, which may cause interference to the data line.

Referring to FIG. 4, in order to mitigate interference between the first transistor T1 and the organic photodiode (OPD), the film layout of the first transistor T1 and the film layout of the organic photodiode (OPD) should not overlap in the vertical direction as far as possible. If the area of the OPD photosensitive region is sufficient to meet the demand, the area of the OPD photosensitive region may be shrunk so as to keep the OPD photosensitive region away from the data line 32.

In FIG. 4, the labels 19, 20, 21, 8 represent the boundaries of four film layers: a metal layer, a first transparent electrically conductive layer, a photosensitive material layer, and a first passivation layer, respectively.

The positional relationship among the metal layer, the first transparent electrically conductive layer, the photosensitive material layer, and the first passivation layer is described as follows:

(1) Either of the metal layer 19 and the photosensitive material layer 21 may be on the outermost side of the film layers. Conventionally, a pixel-level patterning process suitable for mass production of the photosensitive material layer is not available, and therefore the photosensitive material layer is generally continuous; patterning of a large area on the order of millimeters or more can adopt a coating process such as slot die; the pixel-level patterning can adopt an ink-jet printing process or a process similar to OLED EL evaporation. The pixel-level patterning of the photosensitive material layer is shown in the drawing exemplarily.

(2) The boundary of the first passivation layer 8 does not exceed the boundary of the metal layer 19.

(3) The boundary of the first passivation layer 8 does not exceed the boundary of the first transparent electrically conductive layer.

(4) The boundaries of the first transparent electrically conductive layer 21 and the metal layer 19 are not limited in size.

Optionally, the first transistor is an oxide thin film transistor, the gate of the first transistor is on a side of the active layer away from the base substrate.

Figure 5:
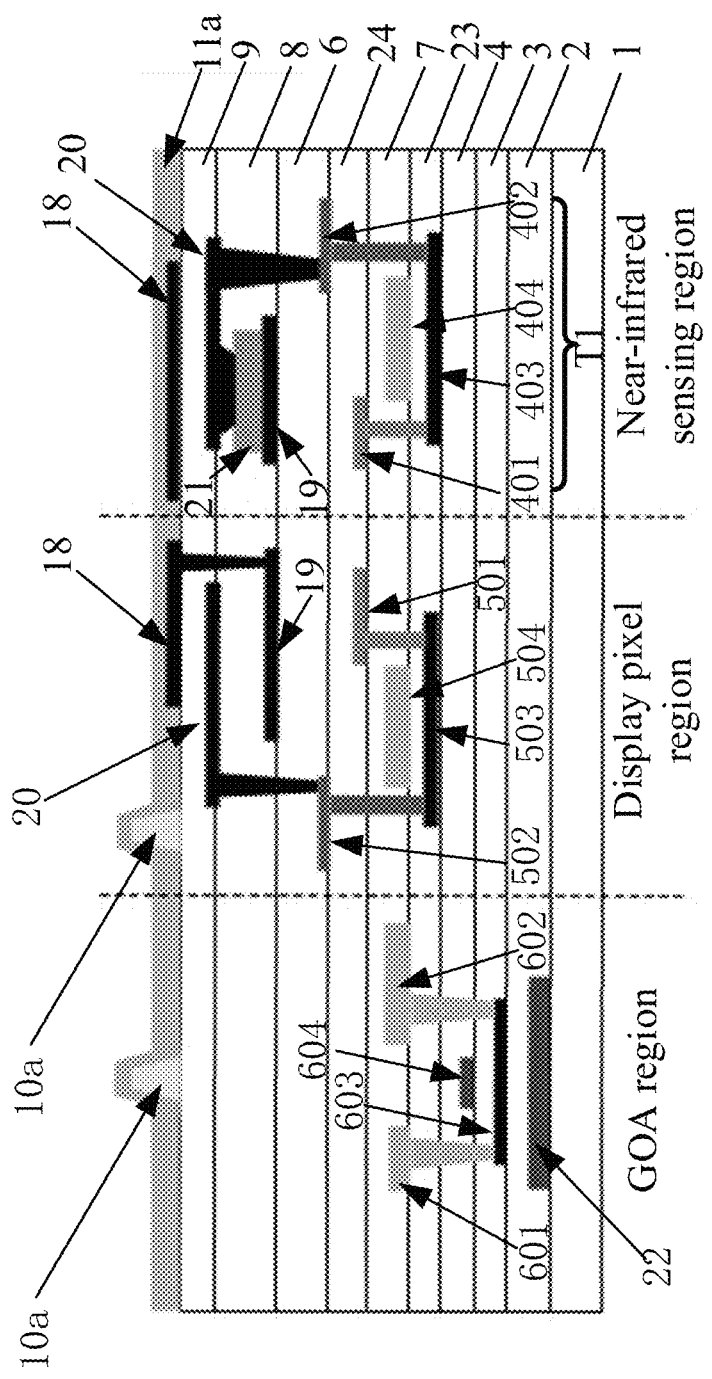
FIG. 5 is a schematic diagram showing the structure of another display substrate according to an embodiment of the present disclosure.
Figure 6:
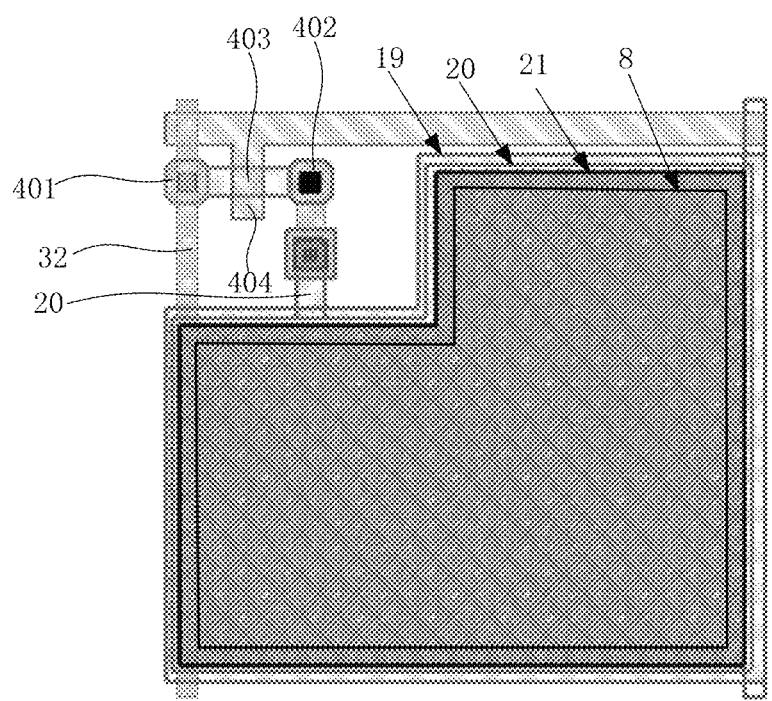
FIG. 6 is a schematic diagram showing the layout of another driving circuit according to an embodiment of the present disclosure.

FIG. 5 is a schematic diagram showing the structure of another display substrate according to an embodiment of the present disclosure; FIG. 6 is a schematic diagram showing the layout of another driving circuit according to an embodiment of the present disclosure.

FIG. 5 differs from FIG. 2 in that the first transistor T1 in FIG. 5 is of a top gate structure.

The display substrate shown in FIG. 5 only includes an array substrate portion, and both the color film substrate and the liquid crystal cell have been omitted from the drawing.

With reference to FIGS. 5, 3 and 6, the layout of film layers corresponding to the array substrate according to the embodiment of the present disclosure includes a base substrate 1 and following layers which are stacked in sequence along a direction away from the base substrate 1: a light-shielding layer 22, a buffer layer 2, a Poly-Si layer, a first gate insulating layer 3, a first gate metal layer, a first interlayer dielectric layer 4, an oxide active layer, a second gate insulating layer 23, a second gate metal layer, a second interlayer dielectric layer 6, a first source/drain metal layer, a third interlayer dielectric layer 24, a second source/drain metal layer, a planarization layer 7, a metal layer 19, a photosensitive material layer 21, a first passivation layer 8, a first transparent electrically conductive layer 20, a third passivation layer 9, a second transparent electrically conductive layer 18, a first spacer layer 10a and a first PI alignment layer 11a.

It is to be noted that the buffer layer 2 and the first gate insulating layer 3 do not require a mask process.

In the array substrate according to the embodiment of the present disclosure, low-temperature poly-silicon (LTPS) thin film transistors (TFTs) are used in a GOA region, and oxide TFTs are used in the display region and the near-infrared sensing region.

The TFT of the GOA region includes a source 601, a drain 602, an active layer 603 and a gate 604. The source 601 and the drain 602 are formed using the second gate metal layer, the active layer 303 is formed using the Poly-Si layer, and the gate 304 is formed using the first gate metal layer. The light-shielding layer 22 is provided under the active layer 603 to shield against stray light.

The TFT of the display pixel region includes a source 501, a drain 502, an active layer 503 and a gate 504. The source 501 is formed using the first source/drain metal layer, the drain 502 is formed using the second source/drain metal layer, the active layer 503 is formed using the oxide active layer, and the gate 204 is formed using the second gate metal layer.

In the display region, the metal layer 19 and the second transparent electrically conductive layer 18 are connected together to serve as a common electrode, and the first transparent electrically conductive layer 20 serves as a pixel electrode. The metal layer 19 may also be made of an ITO material transparent to visible light.

The first transistor T1 of the driving circuit is one thin film transistor on the array substrate. The first transistor T1 of the near-infrared sensing region shown in FIG. 5 includes a source 401, a drain 402, an active layer 403, and a gate 404. The source 401 is formed using the first source/drain metal layer, the drain 402 is formed using the second source/drain metal layer, the active layer 403 is formed using the oxide active layer, and the gate 404 is formed using the second gate metal layer. The drain 402 of the first transistor T1 is electrically connected to the cathode (shown as the first transparent electrically conductive layer 20) of the photodiode.

The light-shielding layer 22 is directly below the channel of the active layer 403, to serve as a shield.

The positional relationship among the metal layer 19, the first transparent electrically conductive layer 20, the photosensitive material layer 21, and the first passivation layer 8 is the same as described above.

Optionally, the driving circuit further includes: a second transistor, a third transistor, a reset signal line, a power supply signal line and an initialization signal line; wherein a source of the second transistor is electrically connected to the power supply signal line, a drain of the second transistor is electrically connected to the drain of the first transistor, and a gate of the second transistor is electrically connected to the cathode of the photodiode;

a source of the third transistor is electrically connected to the initialization signal line, a drain of the third transistor is electrically connected to the cathode of the photodiode, and a gate of the third transistor is electrically connected to the reset signal line;

the anode of the photodiode is connected to a bias voltage.

Optionally, the second transistor includes a drive transistor, and the third transistor includes a reset transistor.

The driving circuit according to the embodiment of the present disclosure includes the first transistor, the second transistor and the third transistor, that is, a 3T1C pixel circuit is adopted. The 3T1C pixel circuit has a better noise suppression effect than that of the 1T1C pixel circuit, and the 3T1C pixel circuit has a signal amplification effect, and as a whole, will have a better signal-to-noise ratio than that of the 1T1C pixel circuit.

Figure 7:
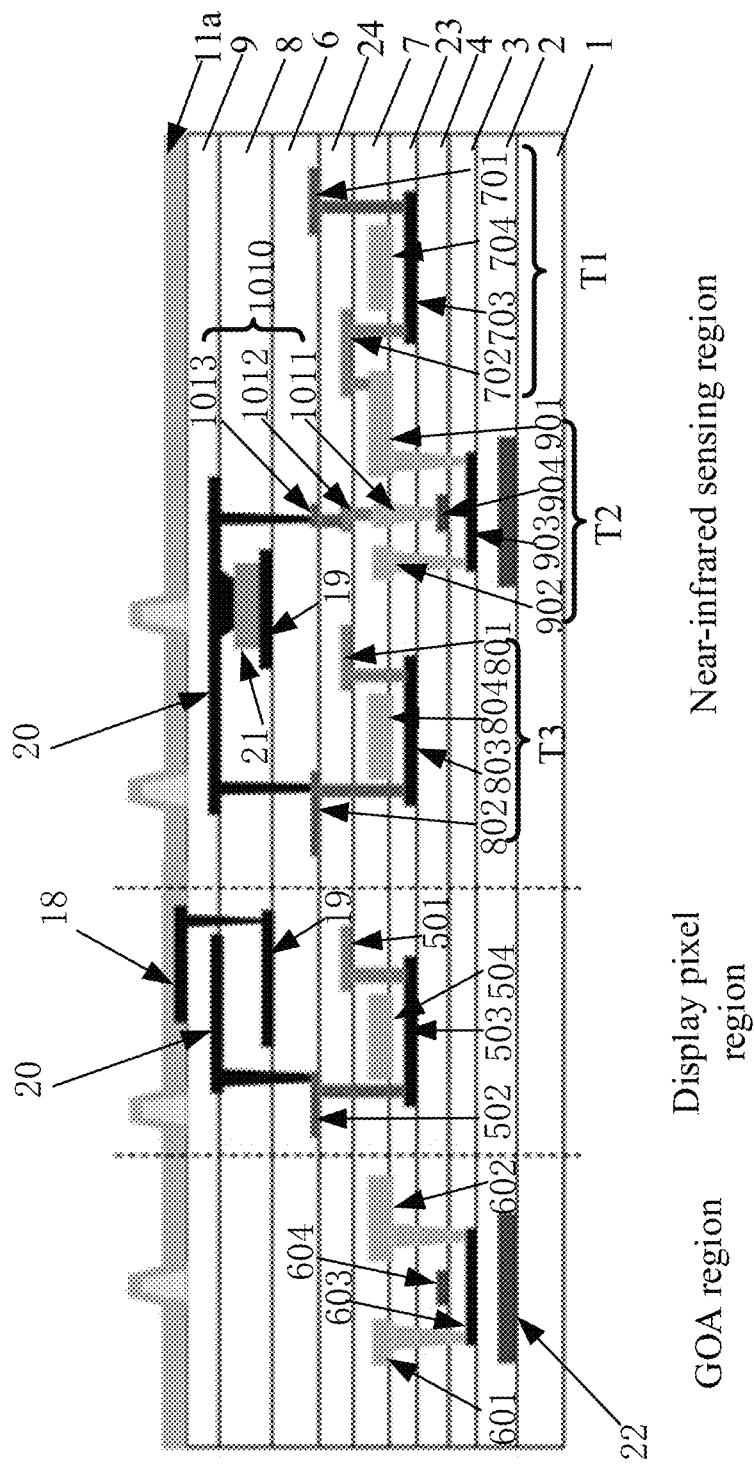
FIG. 7 is a schematic diagram showing the structure of yet another display substrate according to an embodiment of the present disclosure.
Figure 8:
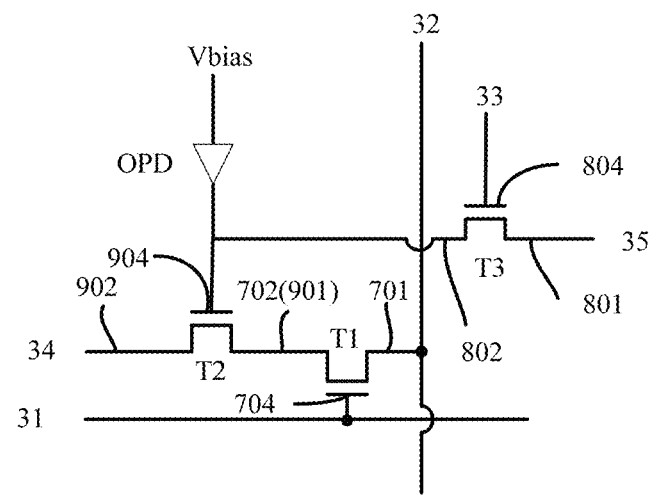
FIG. 8 is a schematic diagram of yet another driving circuit according to an embodiment of the present disclosure.
Figure 9:
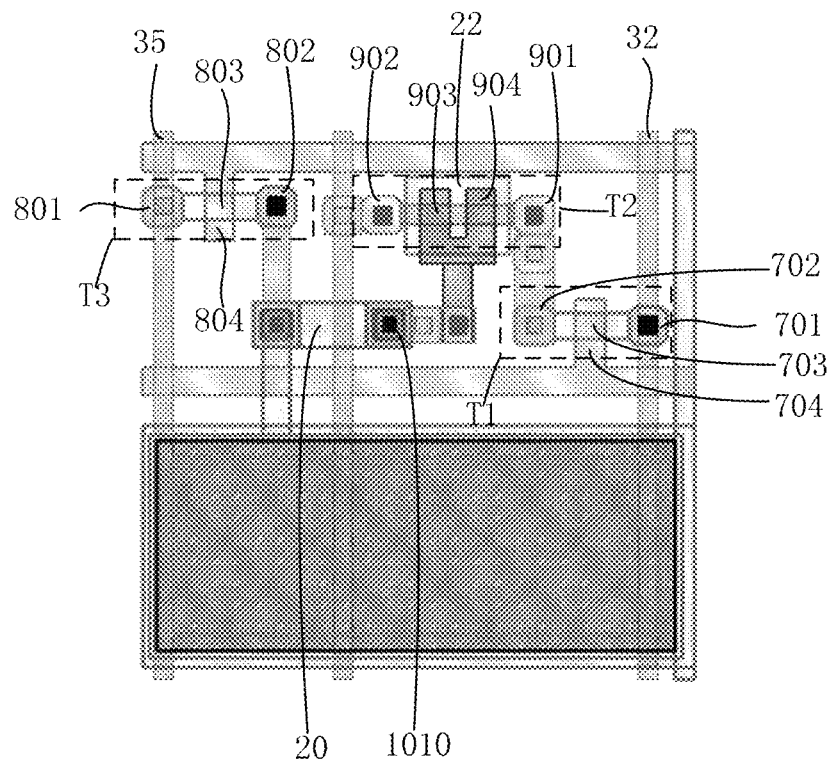
FIG. 9 is a schematic diagram showing the layout of yet another driving circuit according to an embodiment of the present disclosure.

FIG. 7 is a schematic diagram showing the structure of yet another display substrate according to an embodiment of the present disclosure; FIG. 8 is a schematic diagram of yet another driving circuit according to an embodiment of the present disclosure; FIG. 9 is a schematic diagram showing the layout of yet another driving circuit according to an embodiment of the present disclosure.

FIG. 7 differs from FIG. 5 in that the driving circuit in FIG. 7 includes a second transistor T2 and a third transistor T3, in addition to the first transistor T1.

The display substrate shown in FIG. 7 only includes an array substrate portion, and both the color film substrate and the liquid crystal cell have been omitted from the drawing.

With reference to FIGS. 7, 8 and 9, the layout of film layers corresponding to the array substrate according to the embodiment of the present disclosure includes a base substrate 1 and following layers which are stacked in sequence along a direction away from the base substrate 1: a light-shielding layer 22, a buffer layer 2, a Poly-Si layer, a first gate insulating layer 3, a first gate metal layer, a first interlayer dielectric layer 4, an oxide active layer, a second gate insulating layer 23, a second gate metal layer, a second interlayer dielectric layer 6, a first source/drain metal layer, a third interlayer dielectric layer 24, a second source/drain metal layer, a planarization layer 7, a metal layer 19, a photosensitive material layer 21, a first passivation layer 8, a first transparent electrically conductive layer 20, a third passivation layer 9, a second transparent electrically conductive layer 18, a first spacer layer 10a and a first PI alignment layer 11a.

It is to be noted that the buffer layer 2 and the first gate insulating layer 3 do not require a mask process.

In the array substrate according to the embodiment of the present disclosure, low-temperature poly-silicon (LTPS) thin film transistors (TFTs) are used in a gate driver on array (GOA) region, and oxide TFTs are used in the display region and the near-infrared sensing region.

The TFT of the GOA region includes a source 601, a drain 602, an active layer 603 and a gate 604. The source 601 and the drain 602 are formed using the second gate metal layer, the active layer 603 is formed using the Poly-Si layer, and the gate 604 is formed using the first gate metal layer. The light-shielding layer 22 is provided under the active layer 603 to shield against stray light.

The TFT of the display pixel region includes a source 501, a drain 502, an active layer 503 and a gate 504. The source 501 is formed using the first source/drain metal layer, the drain 502 is formed using the second source/drain metal layer, the active layer 503 is formed using the oxide active layer, and the gate 204 is formed using the second gate metal layer.

In the display region, the metal layer 19 and the second transparent electrically conductive layer 18 are connected together to serve as a common electrode, and the first transparent electrically conductive layer 20 serves as a pixel electrode. The metal layer 19 may also be made of an ITO material transparent to visible light.

The first transistor T1 of the driving circuit is one thin film transistor on the array substrate. The first transistor T1 of the near-infrared sensing region shown in FIG. 7 includes a source 701, a drain 702, an active layer 703, and a gate 704. The source 701 is formed using the first source/drain metal layer, the drain 702 is formed using the second source/drain metal layer, the active layer 703 is formed using the oxide active layer, and the gate 704 is formed using the second gate metal layer.

The second transistor T2 of the near-infrared sensing region shown in FIG. 7 includes a source 901, a drain 902, an active layer 903, and a gate 904. The source 901 is formed using the second gate metal layer, the drain 902 is formed using the second gate metal layer, the active layer 903 is formed using the Poly-Si layer, and the gate 904 is formed using the first gate metal layer.

The gate 904 of the second transistor T2 is electrically connected to the first transparent electrically conductive layer 20 via a connecting portion 1010. The connecting portion 1010 includes a first connecting portion 1011, a second connecting portion 1012, and a third connecting portion 1013. The first connecting portion 1011 is formed using the second gate metal layer, the second connecting portion 1012 is formed using the first source/drain metal layer, and the third connecting portion 1013 is formed using the second source/drain metal layer.

The third transistor T3 of the near-infrared sensing region shown in FIG. 7 includes a source 801, a drain 802, an active layer 803, and a gate 804. The source 801 is formed using the first source/drain metal layer, the drain 802 is formed using the second source/drain metal layer, the active layer 803 is formed using the oxide active layer, and the gate 804 is formed using the second gate metal layer.

The drain 802 of the third transistor T3 is electrically connected to the cathode (shown as the first transparent electrically conductive layer 20) of the photodiode.

The light-shielding layer 22 is directly below the channel of the active layer 903, to serve as a shield.

The source 901 of the second transistor T2 is electrically connected to the power supply signal line 34, the drain 902 of the second transistor T2 is electrically connected to the drain 702 of the first transistor T1, and the gate 904 of the second transistor T2 is electrically connected to the cathode (shown as the first transparent electrically conductive layer 20) of the photodiode via the connecting portion 1010;

the source 801 of the third transistor T3 is electrically connected to the initialization signal line 35, the drain 802 of the third transistor T3 is electrically connected to the cathode of the photodiode, and the gate 804 of the third transistor T3 is electrically connected to the reset signal line 33;

the anode of the photodiode is connected to the bias voltage Vbias.

Optionally, the third transistor is an oxide thin film transistor, and the second transistor is a low-temperature polysilicon thin film transistor.

The array substrate according to the embodiments of the present disclosure can reduce power consumption while ensuring a screen display effect by using an oxide thin film transistor as the third transistor and using an LTPS thin film transistor as the second transistor, namely, the array substrate adopts LTPO technology and the liquid crystal display panel adopts LTPO technology.

Optionally, the orthographic projection of the photosensitive material layer of the photodiode onto the base substrate does not overlap with an orthographic projection of the first transistor, the second transistor and the third transistor of the driving circuit onto the base substrate.

In the embodiment of the present disclosure, with the orthographic projection of the photosensitive material layer of the photodiode onto the base substrate not overlapping with the orthographic projection of the first transistor, the second transistor, and the third transistor of the driving circuit onto the base substrate, interference between the photosensitive material layer and the first transistor, the second transistor, and the third transistor can be prevented.

The positional relationship among the metal layer 19, the first transparent electrically conductive layer 20, the photosensitive material layer 21, and the first passivation layer 8 is the same as described above.

Optionally, the display region includes at least one second sensing region; each of the at least one second sensing region is provided with at least one second sensor.

Optionally, the second sensor includes a near-infrared sensor.

In the embodiment of the present disclosure, in addition to a near-infrared sensor provided in the peripheral region, a near-infrared sensor can be provided in the display region, thus a near-infrared sensor can be provided in different regions according to different application scenarios, thereby improving flexibility in display panel design.

For product applications other than VR display products, such as tablet computers, near-infrared sensors can be integrated in the display pixel region, and are applicable to display interaction (writing, remote control).

Optionally, the first transistor is an oxide thin film transistor, the first transistor is a top gate type transistor, the gate of the top gate type transistor is on a side of the active layer away from the base substrate, and an orthographic projection of the gate of the top gate type transistor onto the base substrate is located within an orthographic projection of the active layer of the first transistor onto the base substrate.

A second aspect of the present disclosure provides a display substrate, including the array substrate described above and a color film substrate, wherein the color film substrate includes a black matrix, a peripheral region of the black matrix includes at least one third sensing region, and the at least one third sensing region is in a one-to-one correspondence with the at least one first sensing region of the array substrate; each of the at least one third sensing region includes at least one slit, and the at least one slit is in a one-to-one correspondence with the at least one first sensor.

In the display substrate according to the embodiment of the present disclosure, since a slit corresponding to the near-infrared sensor is provided in the color film substrate, near-infrared light reflected by a user's eye may irradiate the photodiode of the near-infrared sensor through the slit, thereby realizing the eye movement tracking function of a VR display product.

Referring to FIG. 2, a slit (hole) 15 in the color film substrate is equivalent to the optical structure in FIG. 1, and is formed of an opaque material (black matrix (BM) is commonly used), so as to allow near-infrared light reflected by the eye to irradiate the OPD photosensitive units. In the display product, the distance from the eye to the color film substrate is fixed. The distance between the hole and the OPD affects the accuracy of detecting the eye. If the hole is too close to the OPD, eye tracking may not be realized. As a result, the optical structure (hole) requires a special design, possibly requiring an additional lens structure, even a separate and externally attached optical structure. That is, the hole is not formed using the BM, instead, the optical structure is designed/made separately and then attached to the screen surface.

Figure 10:
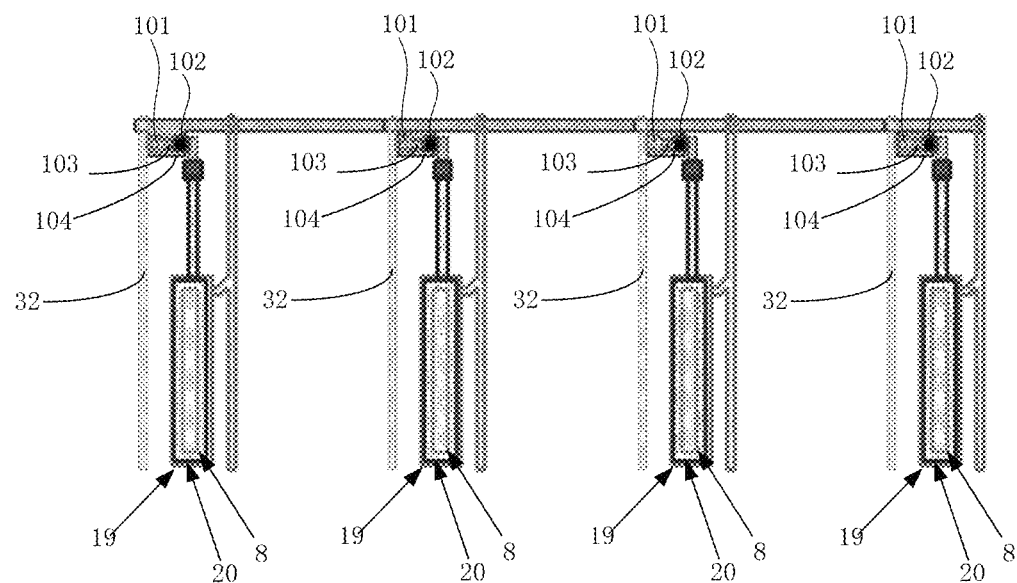
FIG. 10 is a schematic diagram of a photodiode array according to an embodiment of the present disclosure.
Figure 11:
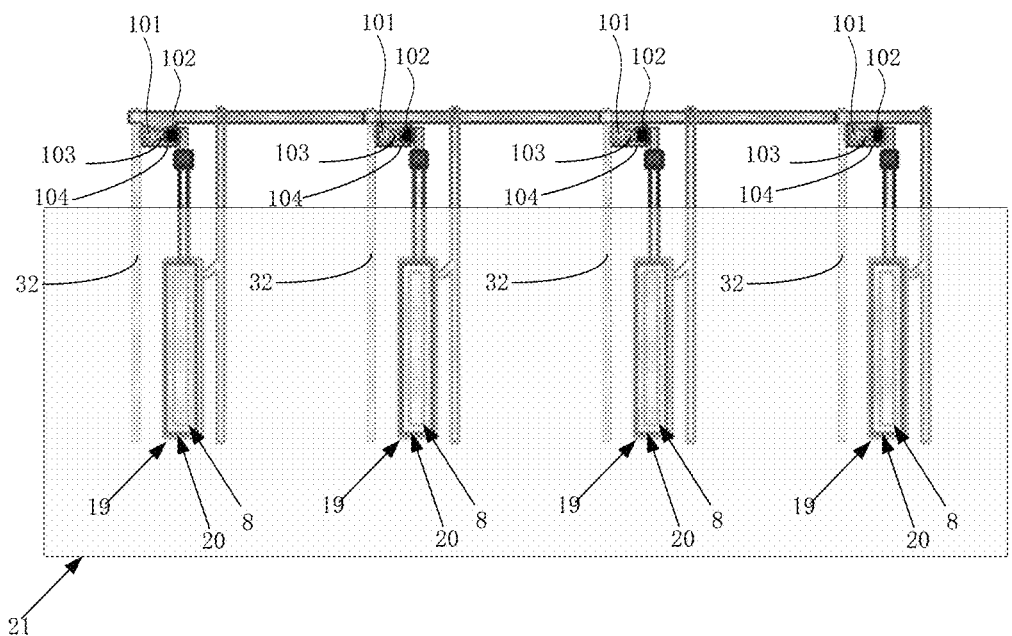
FIG. 11 is a schematic diagram of another photodiode array according to an embodiment of the present disclosure.
Figure 12:
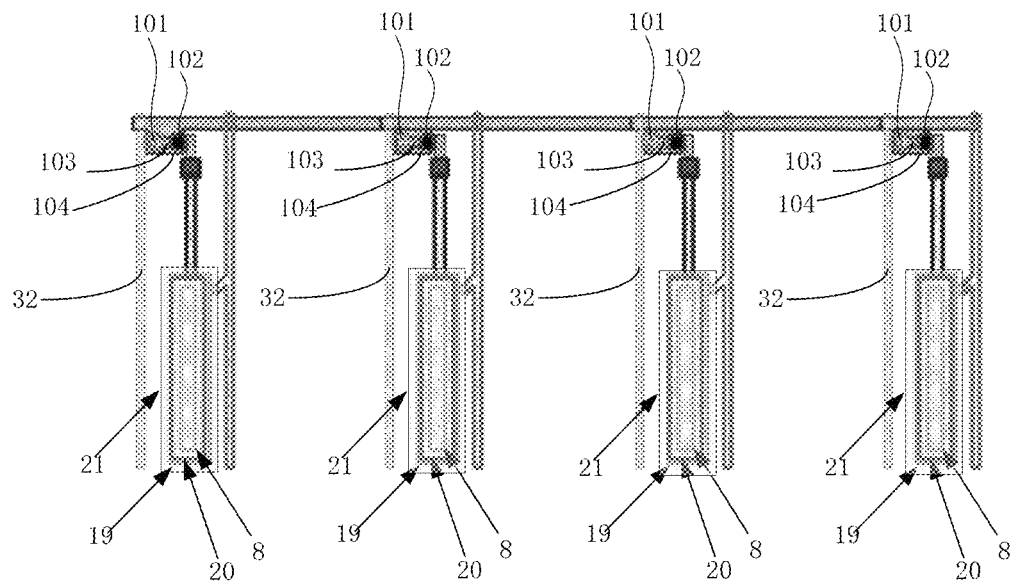
FIG. 12 is a schematic diagram of yet another photodiode array according to an embodiment of the present disclosure.

When the optical structure is an elongated slit, the shape of the OPD should be correspondingly designed to be elongated in correspondence with the orientation of the slit. Four near-infrared sensors are shown in FIGS. 10, 11 and 12. The film structure of each driving circuit is the same as that of the driving circuit shown in FIG. 4.

The OPM is formed using a large area, on the order of millimeters, patterning process, where the OPM is shaped as a long strip. Whether OPM needs to be kept away from TFT is determined according to whether the OPM affects subsequent processes. The photosensitive material layer (OPM) 21 in FIG. 11 covers a relatively large area, and the photosensitive material layers of the four near-infrared sensors are only one layer of photosensitive material. The photosensitive material layers in FIG. 12 are fine processed, and the photosensitive material layers of the near-infrared sensors are not connected to each other and are separated from each other.

A third aspect of the present disclosure provides a display device including the display substrate described above.

The display device includes, but is not limited to: a radio frequency unit, a network module, an audio output unit, an input unit, a sensor, a display unit, a user input unit, an interface unit, a memory, a processor, a power supply, etc. It will be appreciated by those skilled in the art that the configuration of the display device described above is not intended to be limiting and that the display device may include more or fewer of the components described above, or some combinations of the components, or different arrangements of the components. In embodiments of the present disclosure, the display device includes, but is not limited to: a display, a cell phone, a tablet computer, a television, a wearable electronic device, a navigation display device, etc.

The display device may be any product or component with a display function, such as a liquid crystal television, a liquid crystal display, a digital photo frame, a mobile phone, a tablet computer, and the display device further includes a flexible circuit board, a printed circuit board and a back panel.

In the various method embodiments of the present disclosure, the serial numbers of steps are not intended to define the order of the steps, and it is appreciated by a person of ordinary skill in the art, without involving any inventive effort, changes in the order of the steps are also within the scope of the present disclosure.

It should be noted that the various embodiments described herein are described in a progressive manner, and for the description of a same or similar part in an embodiment, references may be made to another embodiment. The description of each embodiment focuses on its difference from other embodiments. In particular, the embodiments are described more simply because they are substantially similar to the product embodiments. For the description of a relevant part, reference may be made to the description of the part of the product embodiments.

Unless defined otherwise, technical or scientific terms used in this disclosure shall have the ordinary meaning as understood by one of ordinary skill in the art to which this disclosure belongs. The terms "first", "second", and the like as used herein do not denote any order, quantity, or importance, but rather are used to distinguish one element from another. The term "comprise", "include" or the like means that an element or item preceding the word encompasses the elements or items listed after the word and equivalents thereof, and does not exclude other elements or items. The term "connecting", "connected" or the like is not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

The above descriptions merely describe specific implementations of the present disclosure, but the scope of the present disclosure is not limited thereto. Any modifications or replacements made by a person skilled in the art without departing from the principle of the disclosure shall fall within the scope of the present disclosure. Accordingly, the protection sought herein is as set forth in the claims below.

What is claimed is:

1. An array substrate, comprising: a display region and a peripheral region surrounding the display region, the peripheral region comprising at least one first sensing region;
   wherein each of the at least one first sensing region is provided with at least one first sensor, the at least one first sensor comprises a photodiode and a driving circuit electrically connected to each other, the photodiode comprises: an anode and a cathode arranged opposite to each other, and a photosensitive material layer between the anode and the cathode; the array substrate comprises:
   a base substrate;
   a plurality of thin film transistors on the base substrate, the thin film transistors each comprising a source and a drain;
   a common electrode on a side of the plurality of thin film transistors away from the base substrate;
   a pixel electrode on a side of the common electrode away from the base substrate, the pixel electrode being electrically connected to the drains of the thin film transistors; wherein,
   the common electrode is reused as an anode of the photodiode;
   the pixel electrode is reused as a cathode of the photodiode;

the driving circuit comprises at least a first transistor, one thin film transistor of the plurality of thin film transistors is reused as the first transistor, and a drain of the first transistor is electrically connected to the cathode of the photodiode.

2. The array substrate according to claim 1, wherein the photodiode further comprises a hole transport layer between the anode and the photosensitive material layer, the hole transport layer is made of any one of molybdenum oxide, nickel oxide, copper chloride, copper sulfide and tungsten oxide;
the photodiode further comprises an electron transport layer between the photosensitive material layer and the cathode, and the electron transport layer is made of any one of zinc oxide, zinc tin oxide, indium gallium zinc oxide, zinc aluminum oxide.

3. The array substrate according to claim 1, wherein the first transistor is an oxide thin film transistor, and an orthographic projection of an active layer of the first transistor onto the base substrate is located within an orthographic projection of a gate of the first transistor onto the base substrate, or the orthographic projection of the gate of the first transistor onto the base substrate is located within the orthographic projection of the active layer of the first transistor onto the base substrate.

4. The array substrate according to claim 1, wherein the driving circuit further comprises:
a data line and a scanning line, the data line is electrically connected to a source of the first transistor, the scanning line is electrically connected to a gate of the first transistor.

5. The array substrate according to claim 4, wherein an orthographic projection of the data line onto the base substrate does not overlap with an orthographic projection of the photosensitive material layer of the photodiode onto the base substrate.

6. The array substrate according to claim 4, wherein the driving circuit further comprises: a second transistor, a third transistor, a reset signal line, a power supply signal line and an initialization signal line;
a source of the second transistor is electrically connected to the power supply signal line, a drain of the second transistor is electrically connected to the drain of the first transistor, and a gate of the second transistor is electrically connected to the cathode of the photodiode;
a source of the third transistor is electrically connected to the initialization signal line, a drain of the third transistor is electrically connected to the cathode of the photodiode, and a gate of the third transistor is electrically connected to the reset signal line;
the anode of the photodiode is connected to a bias voltage.

7. The array substrate according to claim 6, wherein the bias voltage is 0 V to −6 V.

8. The array substrate according to claim 6, wherein the third transistor is an oxide thin film transistor, and the second transistor is a low-temperature polysilicon thin film transistor.

9. The array substrate according to claim 6, wherein an orthographic projection of the photosensitive material layer of the photodiode onto the base substrate does not overlap with an orthographic projection of the first transistor, the second transistor and the third transistor of the driving circuit onto the base substrate.

10. The array substrate according to claim 1, wherein the array substrate further comprises:
a first passivation layer between the common electrode and the pixel electrode, the first passivation layer comprising a plurality of recesses;
the first passivation layer is on a side of the photosensitive material layer away from the base substrate;
the pixel electrode is bonded to the photosensitive material layer in the recesses.

11. The array substrate according to claim 1, wherein the common electrode comprises at least a metal layer and a transparent electrically conductive layer arranged in a stack, and the metal layer is made of any one of aluminum, silver, copper, and iron.

12. The array substrate according to claim 1, wherein the display region comprises at least one second sensing region; each of the at least one second sensing region is provided with at least one second sensor.

13. A display substrate, comprising an array substrate and a color film substrate, wherein
the array substrate comprises: a display region and a peripheral region surrounding the display region, the peripheral region comprising at least one first sensing region;
wherein each of the at least one first sensing region is provided with at least one first sensor, the at least one first sensor comprises a photodiode and a driving circuit electrically connected to each other, the photodiode comprises: an anode and a cathode arranged opposite to each other, and a photosensitive material layer between the anode and the cathode; the array substrate comprises:
a base substrate;
a plurality of thin film transistors on the base substrate, the thin film transistors each comprising a source and a drain;
a common electrode on a side of the plurality of thin film transistors away from the base substrate;
a pixel electrode on a side of the common electrode away from the base substrate, the pixel electrode being electrically connected to the drains of the thin film transistors; wherein,
the common electrode is reused as an anode of the photodiode;
the pixel electrode is reused as a cathode of the photodiode;
the driving circuit comprises at least a first transistor, one thin film transistor of the plurality of thin film transistors is reused as the first transistor, and a drain of the first transistor is electrically connected to the cathode of the photodiode;
the color film substrate comprises a black matrix, a peripheral region of the black matrix comprises at least one third sensing region, and the at least one third sensing region is in a one-to-one correspondence with the at least one first sensing region of the array substrate; each of the at least one third sensing region comprises at least one slit, the at least one slit is in a one-to-one correspondence with the at least one first sensor.

14. The display substrate according to claim 13, wherein the photodiode further comprises a hole transport layer between the anode and the photosensitive material layer, the hole transport layer is made of any one of molybdenum oxide, nickel oxide, copper chloride, copper sulfide and tungsten oxide;
the photodiode further comprises an electron transport layer between the photosensitive material layer and the cathode, and the electron transport layer is made of any one of zinc oxide, zinc tin oxide, indium gallium zinc oxide, zinc aluminum oxide.

15. The display substrate according to claim 13, wherein the first transistor is an oxide thin film transistor, and an orthographic projection of an active layer of the first transistor onto the base substrate is located within an orthographic projection of a gate of the first transistor onto the base substrate, or the orthographic projection of the gate of the first transistor onto the base substrate is located within the orthographic projection of the active layer of the first transistor onto the base substrate.

16. The display substrate according to claim 13, wherein the driving circuit further comprises:
a data line and a scanning line, the data line is electrically connected to a source of the first transistor, the scanning line is electrically connected to a gate of the first transistor.

17. The display substrate according to claim 16, wherein an orthographic projection of the data line onto the base substrate does not overlap with an orthographic projection of the photosensitive material layer of the photodiode onto the base substrate.

18. The display substrate according to claim 16, wherein the driving circuit further comprises: a second transistor, a third transistor, a reset signal line, a power supply signal line and an initialization signal line;
a source of the second transistor is electrically connected to the power supply signal line, a drain of the second transistor is electrically connected to the drain of the first transistor, and a gate of the second transistor is electrically connected to the cathode of the photodiode;
a source of the third transistor is electrically connected to the initialization signal line, a drain of the third transistor is electrically connected to the cathode of the photodiode, and a gate of the third transistor is electrically connected to the reset signal line;
the anode of the photodiode is connected to a bias voltage.

19. The display substrate according to claim 18, wherein the bias voltage is 0 V to −6 V.

20. A display device, comprising a display substrate, wherein the display substrate comprises an array substrate and a color film substrate, the array substrate comprises: a display region and a peripheral region surrounding the display region, the peripheral region comprising at least one first sensing region;
wherein each of the at least one first sensing region is provided with at least one first sensor, the at least one first sensor comprises a photodiode and a driving circuit electrically connected to each other, the photodiode comprises: an anode and a cathode arranged opposite to each other, and a photosensitive material layer between the anode and the cathode; the array substrate comprises:
a base substrate;
a plurality of thin film transistors on the base substrate, the thin film transistors each comprising a source and a drain;
a common electrode on a side of the plurality of thin film transistors away from the base substrate;
a pixel electrode on a side of the common electrode away from the base substrate, the pixel electrode being electrically connected to the drains of the thin film transistors; wherein,
the common electrode is reused as an anode of the photodiode;
the pixel electrode is reused as a cathode of the photodiode;
the driving circuit comprises at least a first transistor, one thin film transistor of the plurality of thin film transistors is reused as the first transistor, and a drain of the first transistor is electrically connected to the cathode of the photodiode;
the color film substrate comprises a black matrix, a peripheral region of the black matrix comprises at least one third sensing region, and the at least one third sensing region is in a one-to-one correspondence with the at least one first sensing region of the array substrate; each of the at least one third sensing region comprises at least one slit, the at least one slit is in a one-to-one correspondence with the at least one first sensor.

* * * * *